(12) United States Patent
Smith

(10) Patent No.: US 6,549,867 B1
(45) Date of Patent: Apr. 15, 2003

(54) POWER SUPPLY FEED-FORWARD COMPENSATION TECHNIQUE

(75) Inventor: Ronald D. Smith, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/580,028

(22) Filed: May 26, 2000

(51) Int. Cl.$^7$ ............................................. G01R 35/00
(52) U.S. Cl. .................. 702/107; 702/107; 702/126; 702/189; 323/281; 323/293; 323/303; 363/95; 363/97
(58) Field of Search ............................ 702/57, 60–62, 702/64, 65, 85, 108–112, 124, 126, 182, 183, 187, 188, 190, 191, 193, 197, 307; 324/76.11–76.83; 323/281–288, 243, 244, 303; 363/95, 97, 983; 713/300

(56) References Cited

U.S. PATENT DOCUMENTS

| | | | | |
|---|---|---|---|---|
| 5,258,903 A | * | 11/1993 | Rodriguez-Cavazos | 363/21 |
| 5,475,295 A | * | 12/1995 | Hong | 320/43 |
| 5,705,956 A | * | 1/1998 | Neely | 331/25 |
| 5,945,817 A | * | 8/1999 | Nguyen | 323/273 |

* cited by examiner

*Primary Examiner*—Marc S. Hoff
*Assistant Examiner*—Elias Desta
(74) *Attorney, Agent, or Firm*—Jeffrey S. Draeger

(57) ABSTRACT

A power supply feed-forward compensation technique using power consumption hints. One embodiment includes a power estimator to generate a power consumption hint that indicates a power consumption level of a component. A transfer function compensation circuit generates a power supply adjustment signal as a function of the power consumption hint and a power transfer function to the component.

27 Claims, 7 Drawing Sheets

POWER SUPPLY FEED-FORWARD COMPENSATION TECHNIQUE

BACKGROUND OF THE INVENTION

1. Field of the Invention

The present invention pertains to components such as integrated circuits, systems including such components, and power supplies therefore. More particularly, the present invention pertains to the use of a power consumption signal and compensation circuitry to adjust the voltage supplied to a system or a component.

2. Description of Related Art

Proper operation of most electronic devices typically requires power supplies to maintain voltage levels within certain specifications. However, modern electronic devices often achieve power savings by providing power to various components or portions of such components only when needed. Such power saving techniques result in large and rapid changes in power demand as significant portions of the system may be enabled and disabled in time periods on the order of one clock period of a high frequency logic clock in the system. Consequently, modem power delivery systems need to be capable of adapting to large and rapid current changes.

A simple model of a traditional voltage supply includes a voltage source, an equivalent series inductance (ESL) in series with the voltage supply, and an equivalent series resistance (ESR) in series with a capacitor that is parallel to the voltage supply. The ESL and ESR components reflect the reality that no power supply can instantaneously respond to every possible change in load. When a dramatic decrease in current demand occurs, the ESL effectively continues driving current through the load, thus causing a voltage bounce. Similarly, when a large increase in current demand occurs, the ESR resists the immediate increase in current, causing a voltage droop. The output voltage returns to a steady state in a period determined mostly by the ESL and ESR values.

According to traditional techniques, a voltage supply may be kept within an acceptable range by utilizing components which provide a smaller ESL and a smaller ESR. The power supply itself may be changed and/or other techniques may be used, such as distributing capacitors throughout the system. Such techniques typically increase the bulk of the power supply or the overall system (e.g., in the case where capacitors are added). Increasing the overall size of the power distribution network exacerbates the difficulty of controlling the voltage at a component because the overall impedance of the power delivery system is altered by the enlarged network, usually resulting in a degraded response time to load changes. Accordingly, network altering techniques are somewhat self defeating because the changes to the power supply network necessitate further compensating improvements.

Another prior art approach to reducing power supply swings involves actively adjusting the power supply (see, e.g., U.S. Pat. No. 5,945,817). This prior art technique utilizes a power indicator signal from a component to adjust the voltage output from the power supply. The power supply increases the voltage when the component switches to a lower power mode (anticipating an increase in power consumption) and decreases the power supply when the component switches to a higher power mode (anticipating a decrease in power consumption). In this manner, the power supply makes pre-emptive adjustments that may reduce an expected range of voltages supplied to the component.

Such a pre-emptive adjustment approach may not be optimal, however, for all systems. Using such an approach, there is no attempt to maintain a constant voltage supply output value. Additionally, such a system does not necessarily consider the "transfer function" that is inherent in the particular power supply of every electronic system. This transfer function is the complex impedance between the source and the load, and it affects the ability of the power supply to deliver the desired voltage to the load. Prior art approaches fail to adequately consider the effects of the power supply transfer function of the system in conjunction with power consumption hints in adjusting voltages supplied to a system.

DESCRIPTION OF THE FIGURES

The present invention is illustrated by way of example and not limitation in the figures of the accompanying drawings.

DETAILED DESCRIPTION

The following description provides a power supply feed-forward compensation technique. In the following description, numerous specific details such as signal representations, power supply implementations, and logic partitioning choices are set forth in order to provide a more thorough understanding of the present invention. It will be appreciated, however, by one skilled in the art that the invention may be practiced without such specific details. In other instances, control structures and gate level circuits have not been shown in detail in order not to obscure the invention. Those of ordinary skill in the art, with the included descriptions, will be able to implement the necessary logic circuits without undue experimentation.

The disclosed techniques may advantageously provide a power supply system that achieves improved responsiveness to load changes. Information such as voltage changes at the supply and load as well as power consumption hints from one or more components may be processed to generate a power supply adjustment. With intelligently improved responsiveness, the system may advantageously provide a more stable voltage with a less bulky or expensive power supply and/or fewer capacitors. Removing capacitors from the system may have the effect of allowing a smaller power distribution network, which in turn creates a more controllable power distribution network, thereby compounding the advantage of the technique.

Figure 1:
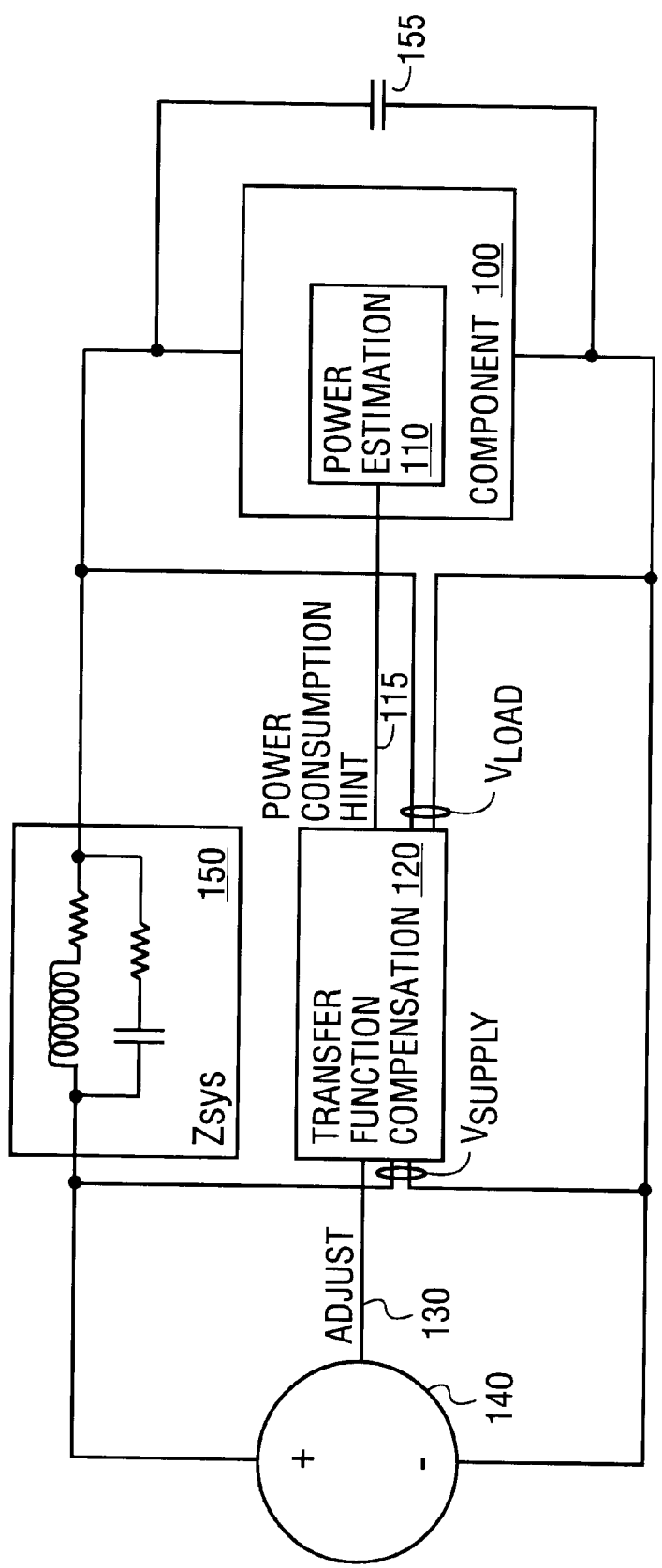
FIG. 1 illustrates one embodiment of a system having a feed-forward power supply compensation circuit that utilizes power consumption hints.

FIG. 1 illustrates one embodiment of a system that utilizes a transfer function compensation circuit 120 to improve the responsiveness of the overall power supply network of the system. The transfer function compensation circuit 120 takes as inputs a power consumption hint signal 115, a voltage level sensed at or close to a load ($V_{load}$), and a voltage level sensed at or close to the power supply ($V_{supply}$). With these inputs, the transfer function compensation circuit 120 can compute an effective transfer function of the system from a voltage supply 140 to the load and compensate for voltage fluctuations at the load accordingly.

As illustrated in FIG. 1, the transfer function is represented by the system impedance 150 ($Z_{sys}$). The system impedance is shown modeled as one discrete set of components, but it is to be understood that the system impedance is distributed throughout the power supply network. A traditional power supply does not compensate for the distributed system impedance other than reactively through the voltage fluctuations received at the voltage supply through the network. Additionally, a capacitor 155 is shown in FIG. 1 in parallel with the load, a component 100. This capacitance is typically deliberately added to the system to improve the stability of the voltage at the load, and also typically has a larger effect on system response than the system impedance ($Z_{sys}$).

Instead of just reacting to local fluctuations, the system in FIG. 1 utilizes feed-forward and remote sensing techniques. A feed-forward technique involves anticipating a particular system transfer function and accordingly altering the voltage waveform that would have been generated if the transfer function had not been taken into account. In the illustrated system, changes at the load also may be remotely sensed (e.g., away from the power supply, at the load) to help adjust the power supply. The system need not anticipate power consumption changes or act preemptively, but rather may lessen transient effects by sensing voltage and power consumption levels and compensating in a manner calculated through an understanding of the system transfer function to deliver the desired voltage at the load(s).

The embodiment illustrated in FIG. 1 has the component 100 as a load. In other embodiments, however, the component 100 could be a series of components or sub-components and that other partitioning options are possible. Additionally, in some cases, it may be desirable to integrate the transfer function compensation circuitry and/or some power supply circuitry with certain components. Thus, the various components shown may be integrated into a single device or distributed variously in different devices in different embodiments.

The component 100 includes a power estimation circuit 110 that generates the power consumption hint signal 115. The power consumption hint signal 115 provides an indication of how much power the component is consuming at a given time. The hint assists the transfer function compensation circuit 120 in generating an adjustment signal to improve the delivery of power to the component 100. The granularity of the reading may vary in different embodiments, with a higher degree of granularity generally improving the ability of the system to smooth the power supply. Various embodiments may use remote sensing in conjunction with power consumption hints to implement a feed-forward system, or may use one or the other.

The transfer function compensation circuit 120 therefore receives as inputs supply and load voltages, as well as the power consumption hint from the component 100. The transfer function compensation circuit 120 may use digital signal processing (DSP) or other techniques to provide an adjustment signal (ADJUST) 130 to the power supply 140. In some embodiments, more elaborate adaptive filtering techniques may be used. Digital signal processing techniques that effectively tune out an underlying particular impedance characteristic are known and are used in such applications as high speed modems, which test and tune out the underlying impedance characteristic of the phone line.

For example, a transfer function for the system may be computed from the sensed values, and the transfer function compensation circuit may calculate an approximation of the inverse transfer function of the system. Once programmed with an inverse transfer function of the system, the compensation circuit 120 smooths out voltage fluctuations that would otherwise be caused by changes in the power consumption of the component by actively adjusting the voltage supply 140.

In other embodiments, the transfer function compensation circuit 120 may provide a fixed response in a given system based on the assumption that the characteristics of the power supply network are relatively constant. In such embodiments, the voltage reading and power consumption hints are processed in a predetermined manner to generate the voltage adjustment signal.

The power supply shown in FIG. 1 is a traditional adjustable power supply. The power supply adjusts its output based on the adjustment signal received. Such adjustable power supplies are known in the art. The adjustment signal(s) may be provided as analog or digital signals (bused, serial, or otherwise).

Figure 2:
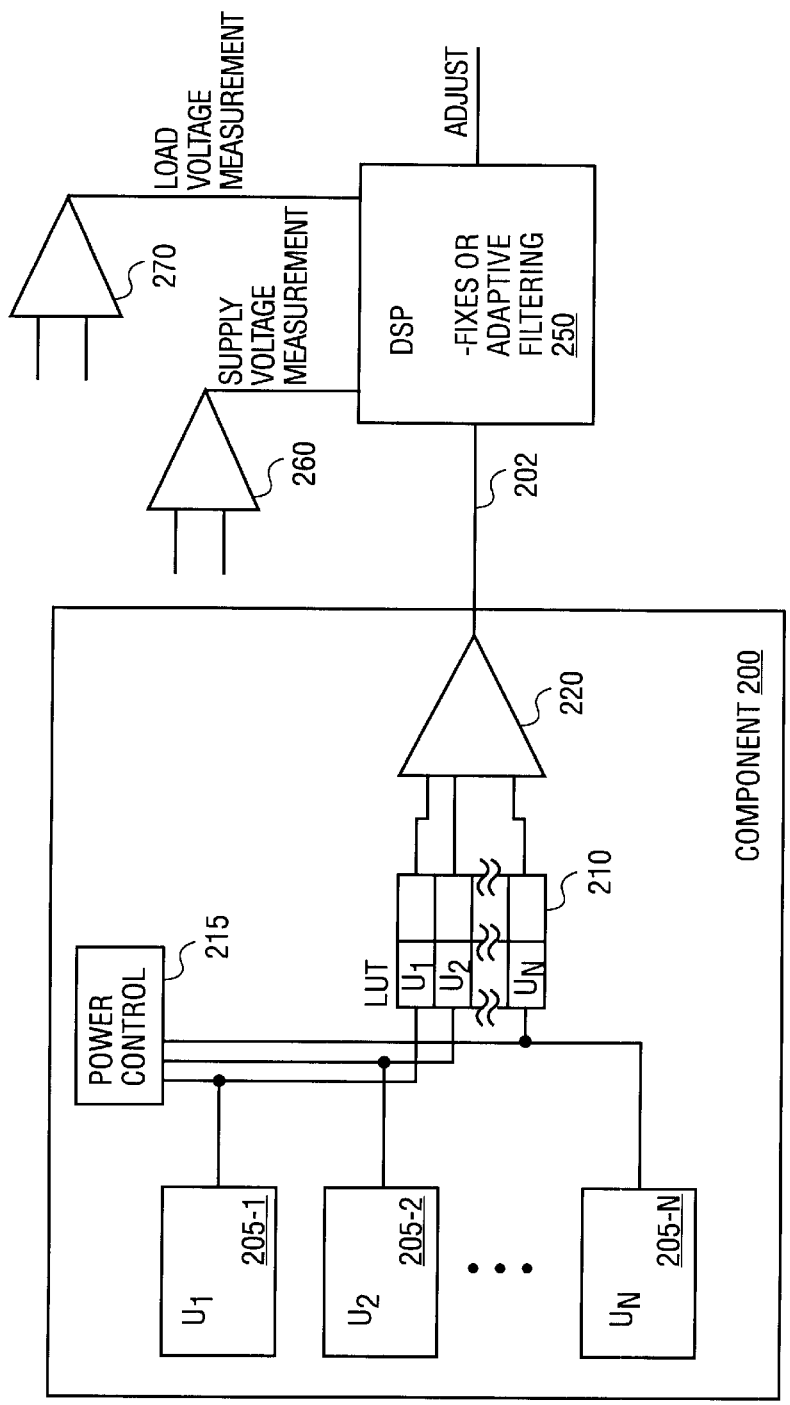
FIG. 2 illustrates one embodiment of a component that generates a power consumption hint and interacts with a digital signal processor that performs compensation calculations.

FIG. 2 illustrates one embodiment of a component 200 that generates a power consumption hint on a signal line 202. In this embodiment, a summation circuit 220 sums a series of values that correspond to the power consumption of enabled functional units. Thus, if any ones of functional units $U_1$–$U_N$ (respectively labeled 205-1 to 205-N) are enabled by a power control circuit 215, then the summation circuit sums an appropriate value from a look-up table (LUT) 210. The LUT allows the different functional units to have different weights that correspond to different power consumption levels. Accordingly, a large unit that consumes much power would provide a larger input to the summation circuit 220 and have a larger impact on the power consumption hint. Additionally, the LUT may contain multiple values for each functional unit. For example, each unit may be controllable to operate at a variety of different power levels. The LUT may provide different values corresponding to the different power consumption levels. The LUT may also be programmable, thereby allowing the weights to be adjusted.

The embodiment of FIG. 2 also includes a digital signal processor (DSP) 250 to perform compensation functions. The DSP 250 receives the power consumption hint on the signal line 202 as well as a supply voltage measurement from a differential amplifier 260 and a load voltage measurement from a differential amplifier 270. The DSP generates the voltage adjustment signal as previously discussed.

Figure 3:
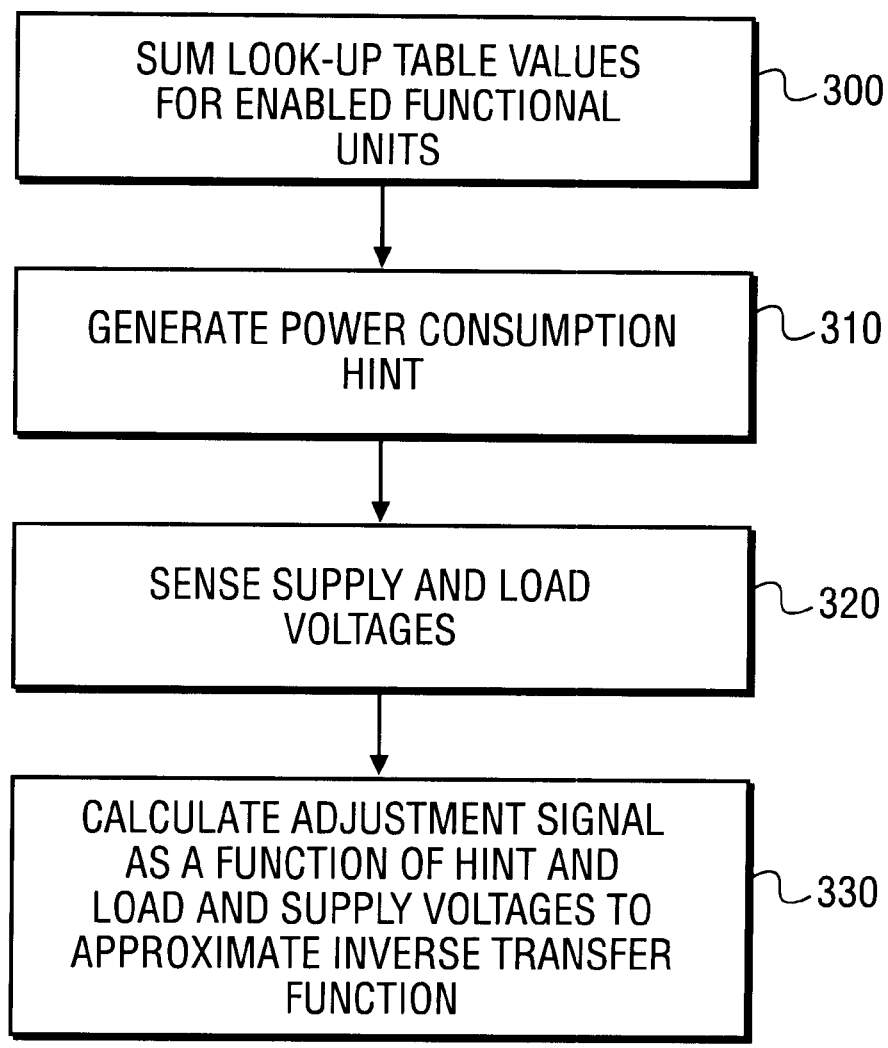
FIG. 3 is a flow chart illustrating operations of a system according to one embodiment.

The flow chart in FIG. 3 illustrates operations performed in one embodiment. As indicated in block 300, the summation circuit 220 sums the look-up table values for the functional units which are enabled. The resulting sum is used to generate the power consumption hint as indicated in block 310. The power consumption hint may be represented in a variety of forms. The power consumption hint may be a multi-bit signal that is sent on a bus or may be a serially delivered multi-bit signal. Alternatively, the power consumption hint may be a pulse width modulated signal.

In some embodiments, the power consumption signal may also be filtered in order to generate a signal that is averaged over time. Averaging may be performed if the response time of the combination of the power control circuit 215, the LUT 210, the summation circuit 220, and the signal line 202 is bandwidth limited. In such a case, if the power consumption hint is not filtered, aliasing and an incorrect frequency response may be produced. An incorrect frequency response could be detrimental to the system stability and operation, and therefore filtering may be used to maintain the frequency components of the hint signal to within the Nyquist frequency of the response path.

As indicated in block 320, the supply and load voltages are sensed. The operations illustrated in FIG. 3 are not necessarily performed sequentially or in the order shown. The order may be changed, or several operations may be performed simultaneously. In block 330, the adjustment signal is calculated as a function of the hint and the load and supply voltages in order to approximate an inverse transfer function for the system. The adjustment signal may be applied to the variable supply voltage to quell transient voltage fluctuations in the system.

Figure 4:
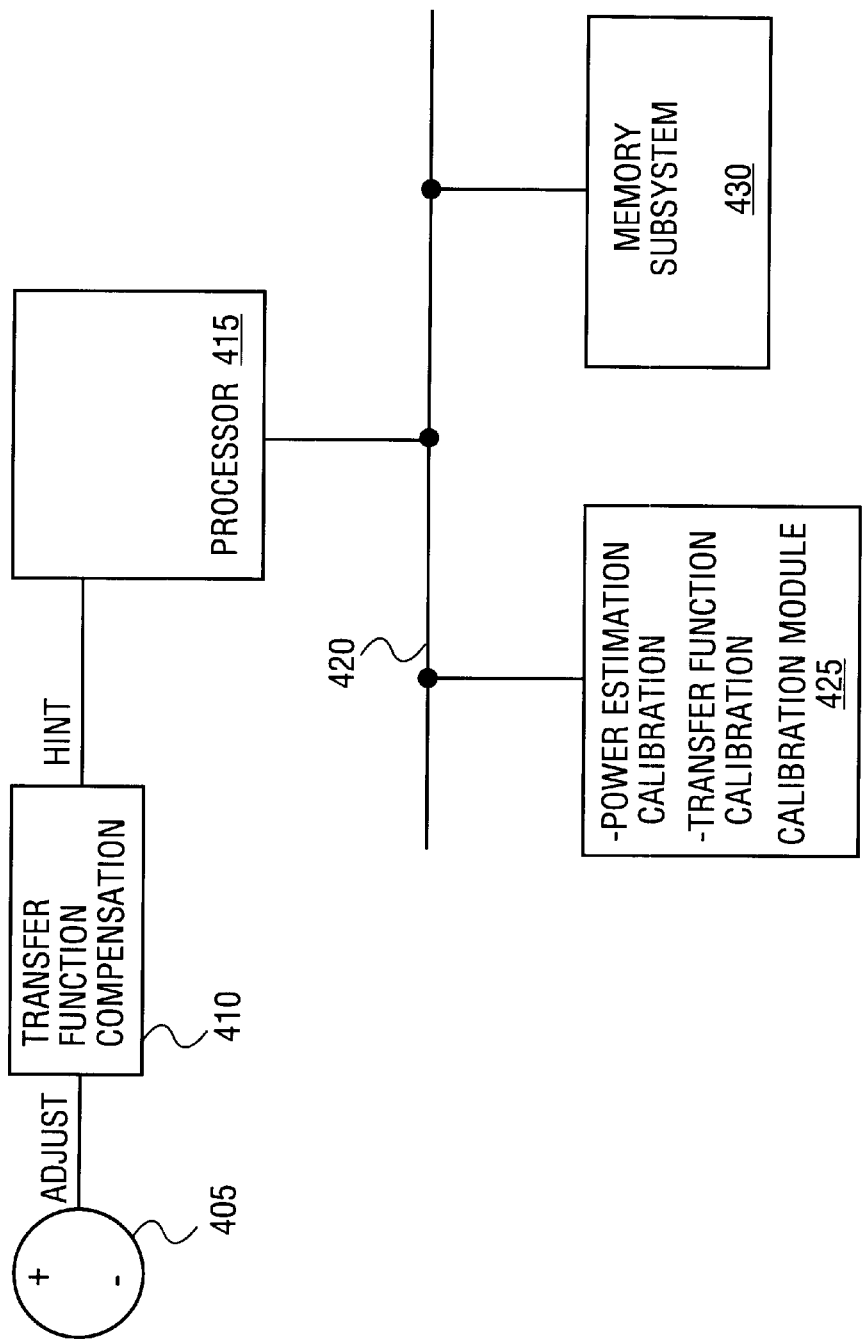
FIG. 4 illustrates details of one embodiment of a system that allows power estimation and transfer function calibration.

FIG. 4 illustrates an embodiment that includes a calibration module 425 that provides power estimation and transfer function calibration modules. These modules need not necessarily both be used in any particular system, and need not be a single module or logical entity. The embodiment of FIG. 4 illustrates a variable voltage supply 405 and a transfer function compensation circuit 410 that generates a voltage adjustment signal (ADJ.) for the variable voltage supply 405. The component generating a power consumption hint in the embodiment of FIG. 4 is a processor 415. The processor 415 is coupled to a bus 420. The bus 420 has coupled thereto a memory subsystem 430 and the calibration module 425. A variety of system configurations may be used.

A system having a power estimation calibration module may advantageously perform actual measurements of power consumption to determine more accurate coefficients or weights for particular units. These weights are in turn used to generate the power consumption hint, so more accurate weights result in more accurate power consumption hints. In some embodiments, power consumption hints and weights may be considered to be more accurate if they provide a more linear representation of the current consumed by the component. In cases where the power consumption hint is processed by a DSP, a more linear set of hint values is likely to results in more stable, accurate, and/or convergent calculations (linear approximations may be used).

Figure 5:
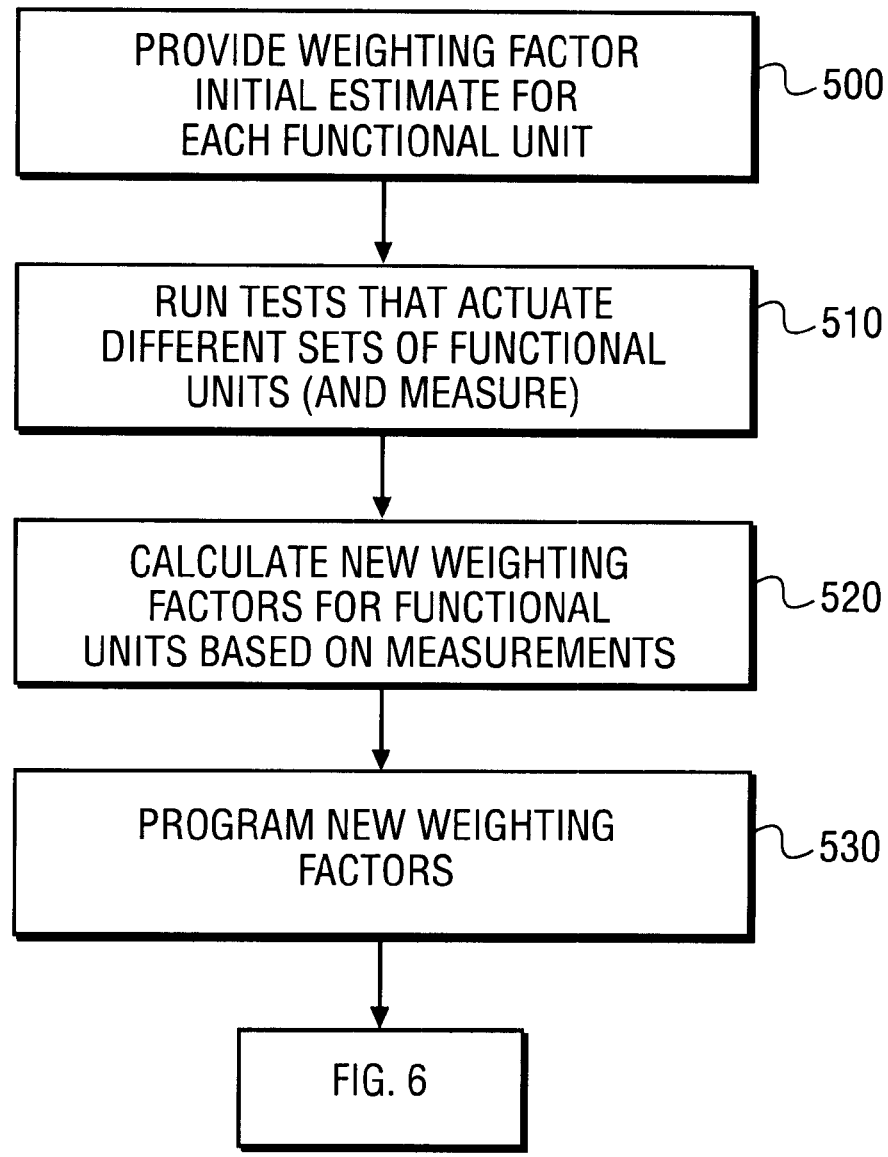
FIG. 5 is a flow chart illustrating power estimation calibration according to one embodiment.

Thus, a power estimation technique such as the one shown in FIG. 5 may be used. Notably, the power estimation procedure may take place during system start-up, boot, or other initialization. In other embodiments, such power estimation calibration may be performed on a different basis. In some systems, power estimation calibration may be performed on occasion, such as once a week, month, or other period of time, or may be performed routinely while the system is running. Other systems may only perform such power estimation calibration once when the system is first turned on or may even perform the power estimation calibration as a part of step in the manufacturing process before the part is shipped.

The calibration modules may be implemented in various manners and each may be implemented differently even in a system in which both are included. A calibration module may be a software routine that is stored in a memory and executed by the processor. The memory may be a non-volatile memory, and the software may be part of an initialization package such as one included in basic input/output software (BIOS). Using a separate memory (apart from main system memory) may allow calibration functions to be performed shortly after the system is turned on, thereby limiting the number of operations performed by the processor until the calibration is done. In some cases, it may be desirable to disable certain features (e.g., clock throttling or other power conservation techniques) or slow down the processor until the calibration is performed.

Alternatively, the modules may be implemented in firmware or hard wired control logic or a combination of software and hardware. For example, the processor may be executing a test program while separate portions of the transfer function module perform current measurements. Alternatively, a separate calibration system may perform calibration functions. Various other arrangements will be apparent to one of skill in the art.

In any case, it is typically prudent (although not absolutely required) to provide a weighting factor initial estimate as indicated in block 500. This initial estimate may be provided through simulations or may be the result of previous power estimation calibrations. Various test programs can be designed to purposely invoke the different functional units on a component. For example, in a microprocessor, programs can be easily designed to use units such as the floating point unit. It may not, however, be possible to isolate only individual functional blocks because multiple functional blocks may be required to execute a meaningful program; however, different sets of functional units may be operated at different times (and the current consumed at each time measured), and the appropriate current consumption values can be calculated. Thus, a program which actuates different sets of functional units is run as indicated in block 510.

Once the various measurements are taken for the sets of functional units, the current consumed by each unit in the actual component (as opposed to a computerized simulation) may be determined. As indicated in block 520, the new weighting factors may then be calculated. The new weighting factors may be programmed into programmable memory locations as indicated in block 530. For example, in the embodiment of FIG. 2, the new weighting factors may be programmed into the LUT 210. The type of memory used to store these values depends on the frequency at which a particular system calibrates these values. If the calibration is performed once as a part of manufacturing, non-volatile memory cells (which may be fuse protected) may be used. In other instances, volatile or non-volatile memories may be appropriate as will be appreciated by one of skill in the art.

Figure 6:
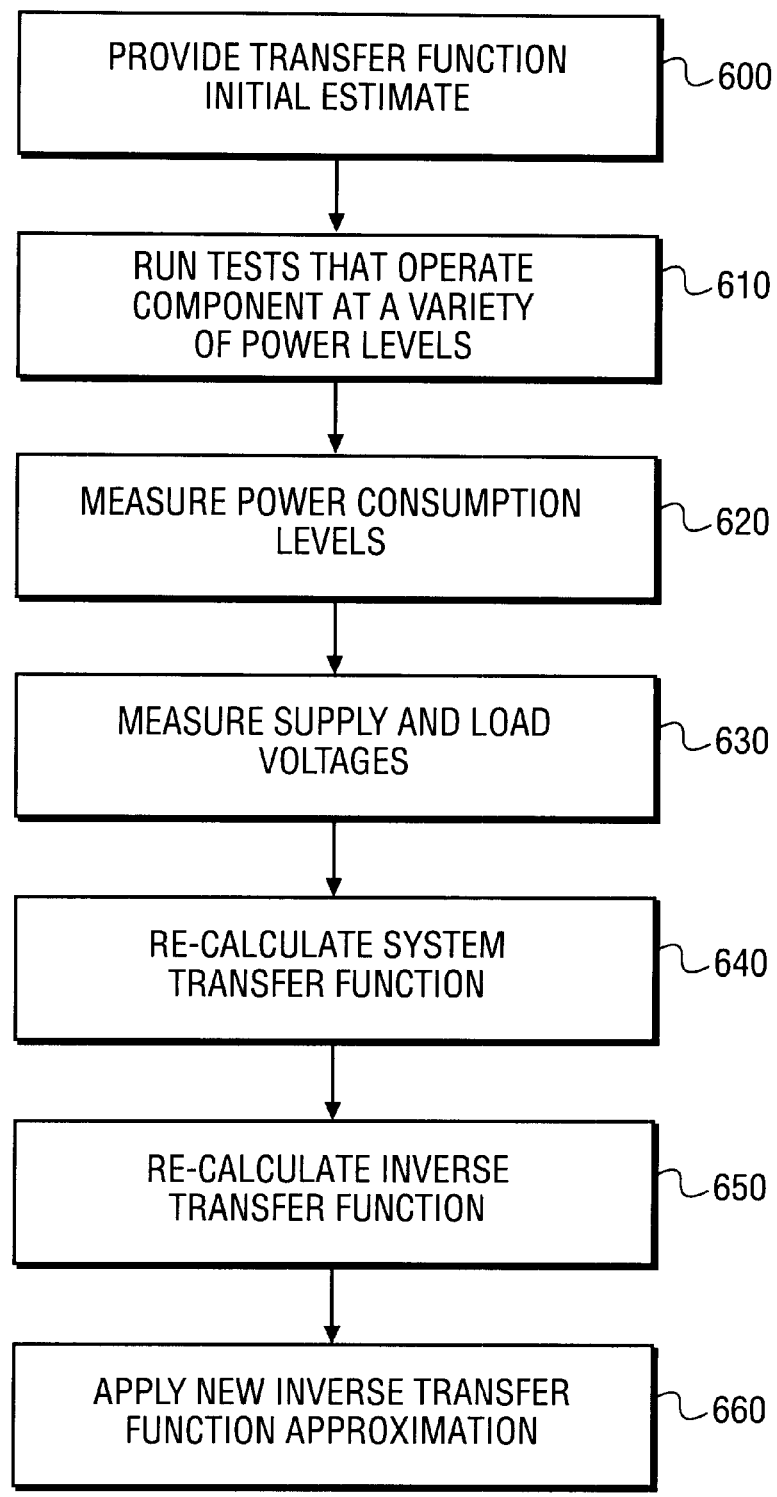
FIG. 6 is a flow chart illustrating transfer function calibration according to one embodiment.

As noted in FIG. 5, some embodiments may continue on to perform transfer function calibration (FIG. 6) after power estimation calibration is complete. In embodiments that include both calibration modules, power estimation calibration may be performed first since the weighting factors affect the power consumption hints which in turn affect the transfer function. In block 600 of FIG. 6, an initial transfer function estimate is provided. As previously noted with respect to the weighting factors, it may be advantageous to use initial estimates to more rapidly arrive at final values. This initial estimate may be provided through simulations or may be the result of previous power estimation calibrations. Having an initial estimate may help the test converge to the actual result more quickly and/or maintain or more accurate power supply voltage so that the overall operation of the processor is sufficiently reliable.

As indicated in block 610, tests that operate the component at a variety of power levels are run. One can design a program that steps through a series of different power levels (thereby generating a series of different power consumption hints) so that the system samples an accurate overall response. The power consumption levels are measured at appropriate points during the tests via the power consumption hints (as indicated in block 620), as are the supply and load voltages (block 630). Again, these blocks may not be performed exclusively sequentially, and may be repeated a number of times.

After the hints and voltage levels are sampled, the system transfer function is recalculated, as indicated in block 640. The transfer function is calculated by knowing the inputs (hints, supply voltage) and the outputs (load voltage) of the system. The inverse transfer function is then also re-calculated, as indicated in block 650. The new inverse transfer function approximation may then be applied to the system to better damp fluctuations in the load voltage, as indicated in block 660.

In some embodiments, the transfer function calibration function is performed as an initialization operation or even before a particular system is shipped. In other embodiments, however, calibration may be performed occasionally, routinely, or continuously. Embodiments that perform continuous transfer function calibration effectively employ adaptive filtering. In such systems, a DSP may continuously adjust an inverse transfer function approximation that is used as a result of the continuing inputs received while various programs are run.

Figure 7:
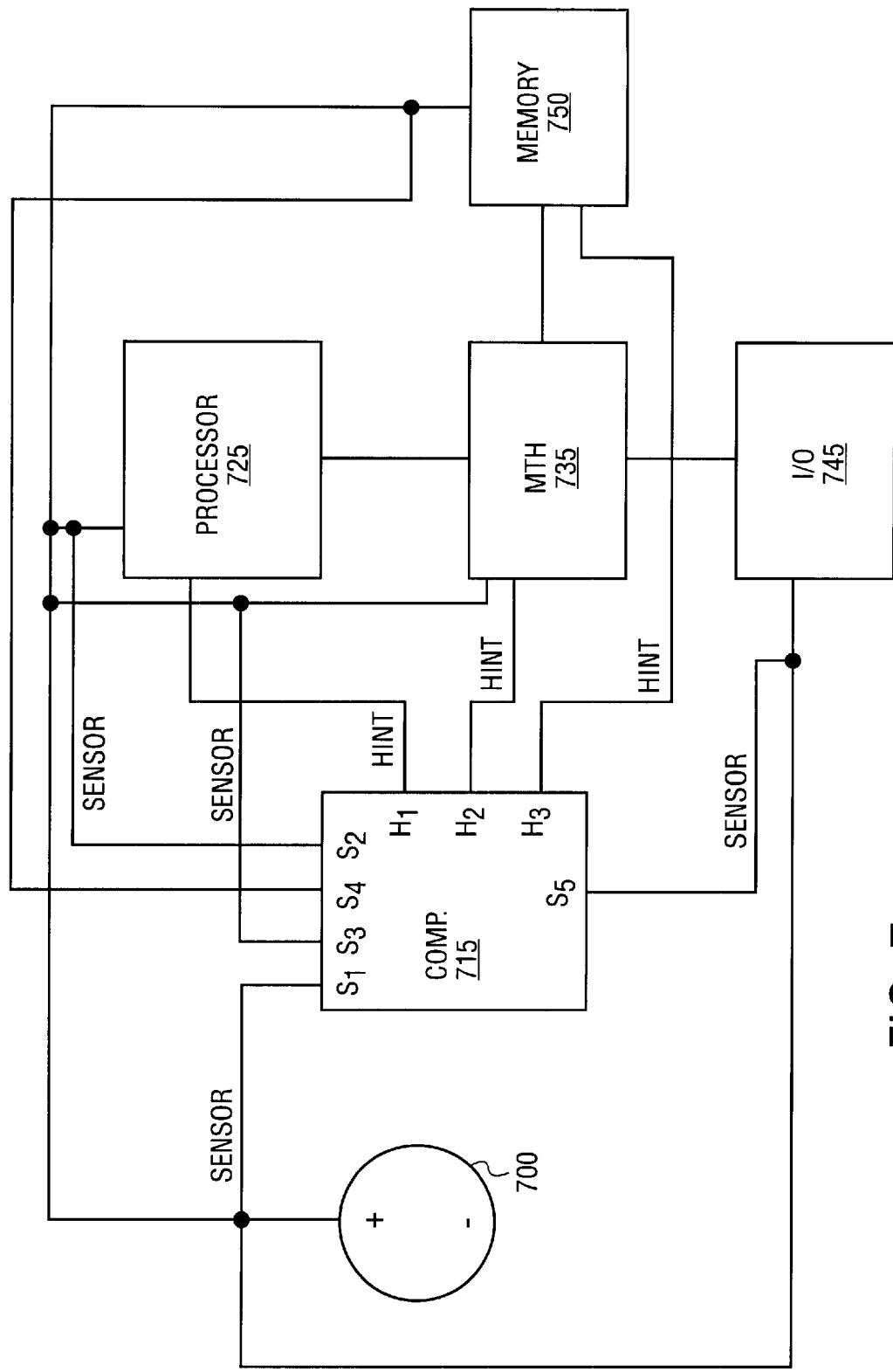
FIG. 7 illustrates the presently disclosed techniques as they may be extended to multiple components within a system.

FIG. 7 illustrates one alternative embodiment that includes a number of sensor points and a number of hints from various components. The embodiment of FIG. 7 includes a power supply 700 to power a processor 725, a memory translation hub (MTH) 735, a memory 750, ant an I/O hub 745. Other or fewer components may be included in some embodiments. The ground connection to the power supply has been omitted to improve clarity.

The processor 700 generates a first power consumption hint ($H_1$) that is received by the compensation circuit 715 and an $H_1$ input. Similarly, the MTH 735 generates a second hint ($H_2$) and the memory 750 generates a third hint ($H_3$). In the illustrated embodiment, the I/O hub 745 does not generate a power consumption hint. In other embodiments, other combinations of components may generate hints and others may not. The compensation circuit 715 may be configured to accept a varying number of hint (and sensor) inputs.

In the embodiment of FIG. 7, the compensation circuit 715 receives sensor inputs from sensors (not shown) which sample the voltage level at the various loads. Thus, the compensation circuit 715 has an $S_1$ input which senses the supply voltage, a $S_2$ input which senses the processor voltage, an $S_3$ input which senses the MTH voltage, a $S_4$ input which senses the memory voltage, and an $S_5$ input which senses the I/O hub voltage.

The compensation circuit may attempt to stabilize overall system power or may attempt to provide a certain quality of power to a particular component or group of components. For example, the techniques described above may also be applied to a particular module such as a processor module, or to a particular circuit board. In any case, transfer function compensation can be extended to such multiple component systems to more intelligently provide the desired power supply waveform.

A number of embodiments of a power supply feed-forward compensation technique have been disclosed. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. An apparatus comprising:

a power estimator to generate a power consumption hint that indicates a power consumption level of a component;

a transfer function compensation circuit to generate a power supply adjustment signal as a function of said power consumption hint and a power transfer function to said component, said power transfer function being derived at least in part from a plurality of sensor inputs.

2. The apparatus of claim 1 wherein said transfer function compensation circuit comprises a digital signal processor that approximates an inverse power transfer function from said power transfer function.

3. The apparatus of claim 1 wherein said transfer function compensation circuit comprises:

a load sensor to receive a load voltage level at the component;

a reference sensor input to receive a supply voltage level;

an inverse transfer function calculation circuit to receive said power consumption hint, said load voltage level, and said supply voltage level and to compute said power supply adjustment signal.

4. The apparatus of claim 3 wherein said inverse transfer function calculation circuit comprises an adaptive filtering circuit.

5. The apparatus of claim 4 wherein said plurality of sensor inputs further comprises:

a hub voltage sensor input;

an I/O voltage sensor input.

6. An apparatus comprising:

a power summation circuit to compute a power consumption hint as a sum of a plurality of weighting values associated with and indicative of a power consumption level of each of a plurality of functional blocks;

a compensation circuit to generate a power supply adjustment signal as a function of the power consumption hint and at least one voltage sensor input.

7. The apparatus of claim 6 wherein said plurality of weighting values linearly represent the power consumption of the plurality of functional blocks.

8. The apparatus of claim 6 wherein said plurality of weighting values are stored in programmable memory locations.

9. The apparatus of claim 6 wherein said power summation circuit is only to include weighting values in said sum for enabled ones of said plurality of functional units.

10. A system comprising:

a processor comprising a power estimation circuit to generate a power consumption estimate;

a variable voltage supply;

a compensation circuit coupled to provide a voltage supply adjustment signal to the variable voltage supply, the voltage supply adjustment signal being a function of the power consumption estimate, a reference voltage sampled proximate said variable voltage supply, and a load voltage sampled proximate said processor.

11. The system of claim 10 further comprising:
a compensation circuit programming module to sequence said processor through a series of power consumption levels to calibrate the compensation circuit.

12. The system of claim 11 wherein the compensation circuit programming module comprises software stored in a machine readable medium.

13. The system of claim 10 further comprising:
a power estimation calibration circuit to calibrate said power estimation circuit according to measured current consumption.

14. The system of claim 13 wherein said power estimation circuit comprises:
a look-up table to store a plurality of weights representative of power consumption levels for each of a plurality of operational units;
a summation circuit to add ones of said plurality of weights corresponding to enabled operational units.

15. The system of claim 14 wherein said power estimation calibration circuit determines each of said plurality of weights.

16. The system of claim 11 further comprising:
a power consumption estimator calibration circuit to calibrate said power estimation circuit according to measured current consumption, said power consumption estimator calibration circuit to be activated prior to said compensation circuit programming module as a part of a calibration procedure.

17. A method comprising:
receiving a power consumption hint from an electronic component;
receiving a plurality of sensor inputs from a plurality of sensor points;
providing a power supply adjustment signal as a function of both the power consumption hint and a system transfer function derived at least in part from the plurality of sensor inputs.

18. The method of claim 17 wherein providing the power supply adjustment signal further comprises adaptively computing and adjusting an inverse transfer function.

19. The method of claim 17 wherein the power supply adjustment signal is a function of the power consumption hint, a power supply input, and a load input.

20. A method comprising:
summing a plurality of initial estimate power consumption weights associated with and indicative of a power consumption level of active ones of a plurality of functional units of a processor to derive a processor power estimate for the processor;
adjusting said plurality of initial estimate power consumption weights based on processor operation.

21. The method of claim 20 wherein adjusting comprises:
running a plurality of tests that actuate different sets of functional units;
measuring power consumption during said plurality of tests;
calculating a new set of power consumption weights based on said measuring.

22. An apparatus comprising:
a plurality of sensor inputs;
a voltage supply adjust signal calculation circuit, said voltage supply adjust signal calculation circuit being coupled to said plurality of sensor inputs to receive a plurality of sensor input signals and to generate as a function of said plurality of sensor input signals a voltage supply adjust signal.

23. The apparatus of claim 22 further comprising:
a power consumption hint input, wherein said voltage supply adjust signal calculation circuit is coupled to said power consumption hint input to receive a power consumption hint signal, and further wherein said voltage supply adjust signal calculation circuit is to calculate said voltage supply adjust signal as a function of said power consumption hint signal.

24. The apparatus of claim 23 wherein said plurality of sensor inputs comprise a voltage source sensor input and a load sensor input.

25. The apparatus of claim 22 wherein said plurality of sensor inputs comprise a voltage source sensor input and a load sensor input.

26. The apparatus of claim 22 wherein said plurality of sensor inputs comprise a voltage source sensor input, a processor sensor input, and a bridge or hub component sensor input.

27. The apparatus of claim 26 wherein said plurality of sensor inputs further comprise a memory sensor input, and an I/O sensor input.

* * * * *

UNITED STATES PATENT AND TRADEMARK OFFICE
CERTIFICATE OF CORRECTION

PATENT NO. : 6,549,867 B1
DATED : April 15, 2003
INVENTOR(S) : Smith

It is certified that error appears in the above-identified patent and that said Letters Patent is hereby corrected as shown below:

Column 1,
Line 24, delete "modem", insert -- modern --.

Column 8,
Line 51, delete "wherein said plurality of weighting values are stored in programmable memory locations.", insert -- wherein said compensation circuit is to generate the power supply adjustment signal as a function of a plurality of voltage sensor inputs from a plurality of electrically distinct points. --.

Signed and Sealed this

Seventh Day of October, 2003

JAMES E. ROGAN
*Director of the United States Patent and Trademark Office*